(12) United States Patent
Rudelic

(10) Patent No.: US 7,251,739 B1
(45) Date of Patent: Jul. 31, 2007

(54) SYSTEM AND METHOD FOR SEQUENCING MULTIPLE WRITE STATE MACHINES

(75) Inventor: John C. Rudelic, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 485 days.

(21) Appl. No.: 10/749,943

(22) Filed: Dec. 31, 2003

(51) Int. Cl.
G06F 1/26 (2006.01)
(52) U.S. Cl. ...................................................... 713/330
(58) Field of Classification Search ................. 713/320
See application file for complete search history.

(56) References Cited

U.S. PATENT DOCUMENTS

| | | | |
|---|---|---|---|
| 4,878,028 A * | 10/1989 | Wang et al. ................. 327/278 |
| 5,793,694 A * | 8/1998 | Akiba et al. ........... 365/230.03 |
| 6,075,741 A * | 6/2000 | Ma et al. ..................... 365/226 |
| 6,191,974 B1 * | 2/2001 | Nishida et al. ......... 365/185.11 |
| 6,937,517 B2 * | 8/2005 | Pekny et al. ........... 365/185.18 |

* cited by examiner

Primary Examiner—Rehana Perveen
Assistant Examiner—Eric Chang
(74) Attorney, Agent, or Firm—Troutman Sanders LLP; Jeff L. Waters; James H. Yancey, Jr.

(57) ABSTRACT

In some embodiments, systems and methods for sequencing multiple write state machines may comprise a pulse generator, a delay circuit, and a stacked memory array, wherein each memory array in the stacked memory array have an individual write state machine. In an exemplary embodiment, the pulse generator may be operable to supply pulses of current to the write state machines so that the system's voltage regulator may accommodate the total aggregated current in the system. In some exemplary embodiments, pulses of current may be applied to the first write machine, and delayed pulses of current may be applied to the second write state machine.

15 Claims, 5 Drawing Sheets

SYSTEM AND METHOD FOR SEQUENCING MULTIPLE WRITE STATE MACHINES

BACKGROUND

The size of electronic systems is constantly being reduced. For electronic systems that require memory devices, one way to reduce the size of the overall system is to use multiple memory arrays, which are typically stacked vertically on top of one another to minimize package area on the circuit board. Multi chip packages of flash memory are especially beneficial for compact devices, such as cellular telephones, personal digital assistants (PDAs), computers, electronic books, handheld electronic games, and the like. However, in many multi chip packages, the cost associated with the memory arrays increases to accommodate the larger amounts of aggregated current required to program each array of the multi chip package simultaneously.

For example, in an electronic system having stacked flash memory, each flash memory typically has a controller, or a write state machine ("WSM"), that performs the flash erase and program operations. Each WSM follows a precise algorithm to program the individual flash memory. Associated with the algorithm is a current draw waveform associated with the current draw. A typical current draw waveform includes a large initial current pulse, which places a voltage on the memory cell, followed by a long pause, in which the WSM determines that the memory cell is responding to the input and a series of smaller pulses, which are used to build the voltage across the memory cell to a predetermined level for an appropriate state. To prevent a voltage overload to the system, the system must incorporate a voltage regulator that is capable of accommodating at least the maximum peak of the current draw profile and that ensures that the correct voltage on the array is maintained.

In current systems, the voltage regulator is just large enough to accommodate a little more current than what is at the maximum peak of the current waveform. Many voltage regulators in current systems are not capable of sustaining any larger amounts of current, as larger voltage regulators tend to be more expensive.

A problem arises when a stacked memory array is placed in an existing system with a voltage regulator capable of accommodating only a certain amount of voltage. Presently, the current waveform from each WSM is applied to each memory array in the stack simultaneously. Therefore, in order to program multiple memory arrays within the stack, the amplitude of the current waveform must be multiplied by the number of memory arrays within a given stack. For example, if two memory arrays are stacked and are to be programmed simultaneously, then the maximum current needed to program the two arrays must be twice the amount of current required to program one memory array. Because many systems have voltage regulators that are just large enough to accommodate a little more than the maximum peak of the current waveform for a single memory array, a new voltage regulator capable of accommodating a larger voltage must be installed in the system.

Unfortunately, increasing the amount of current required to simultaneously program multiple stacked memory arrays requires larger voltage regulators and increases system costs. One way to avoid the costs of simultaneously programming multiple stacked memory arrays is to program the arrays in sequence. For example, in a stacked memory array having two memory arrays, the first memory array would be programmed first, then the second memory array would be programmed. However, as each memory array usually takes several milliseconds to program, two memory arrays would require twice the amount of time needed to program a single memory array, which slows down the overall speed of the systems and increases the system costs.

DETAILED DESCRIPTION OF THE EMBODIMENTS

Figure 1:
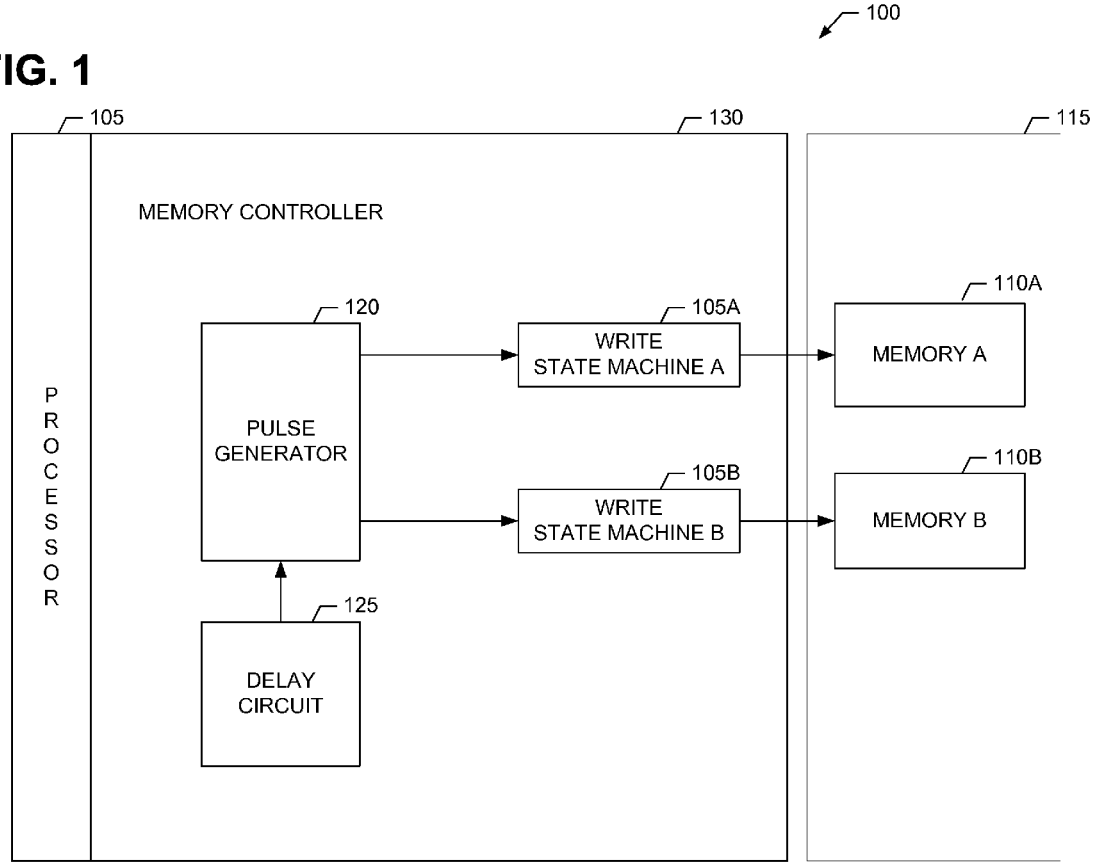
FIG. 1 illustrates a block diagram representation of a system that is configured to sequence multiple write state machines in accordance with some embodiments of the present invention.

Referring now to the drawings, in which like numerals represent like elements or steps throughout the several views, FIG. 1 illustrates a block diagram representation of a system 100 that may contain a processor 105, a memory controller 130, and a stacked memory array 115, which may contain a first memory array 110A and a second memory array 110B. The memory controller 130 may act as an interface to control the flow of data between the processor 105 and the stacked memory array 115. The memory controller 130 may be configured to sequence two write state machines 105A and 105B and to program the stacked memory array 115 having the first memory array 110A and the second memory array 110B in accordance with some embodiments of the present invention.

The first memory array 110A and the second memory array 110B may typically comprise arrays of memory cells. In an exemplary embodiment, the first memory array 110A and the second memory array 110B may be stacked vertically such that the second memory array 110B may be physically on top of the first memory array 110A. In an exemplary embodiment, the memory arrays 110 may typically be NOR flash memory arrays; however, those skilled in the art will appreciate that other types of memory arrays, including but not limited to, NAND flash memory, random access memory ("RAM"), static random access memory ("SRAM"), and the like may be used without deviating from the scope of the embodiments of the present invention. Although the stacked memory array 115 may be described in terms of two memory arrays, those skilled in the art will appreciate that the number of memory arrays 110 is not limited and may contain any number of individual memory arrays 110 without departing from the scope of the embodiments of the present invention.

In an exemplary embodiment, the write state machines 105A, 105B may be the internal controllers of the individual memory arrays 110A, 110B, respectively. The write state machines 105A, 105B may be operable to follow an algorithm to program the individual memory arrays 110 by using pulses of current from a pulse generator 120.

The memory controller 130 may also include the pulse generator 120 that is operable to generate a waveform containing a series of current pulses, which may be supplied to the write state machines 105A, 105B. The pulse generator 120 also communicates with a delay circuit 125 that is operable to inject a time delay between a first pulse of current applied to the first write state machine 105A and a second pulse of current applied to the second write state machine 105B.

Figure 2:
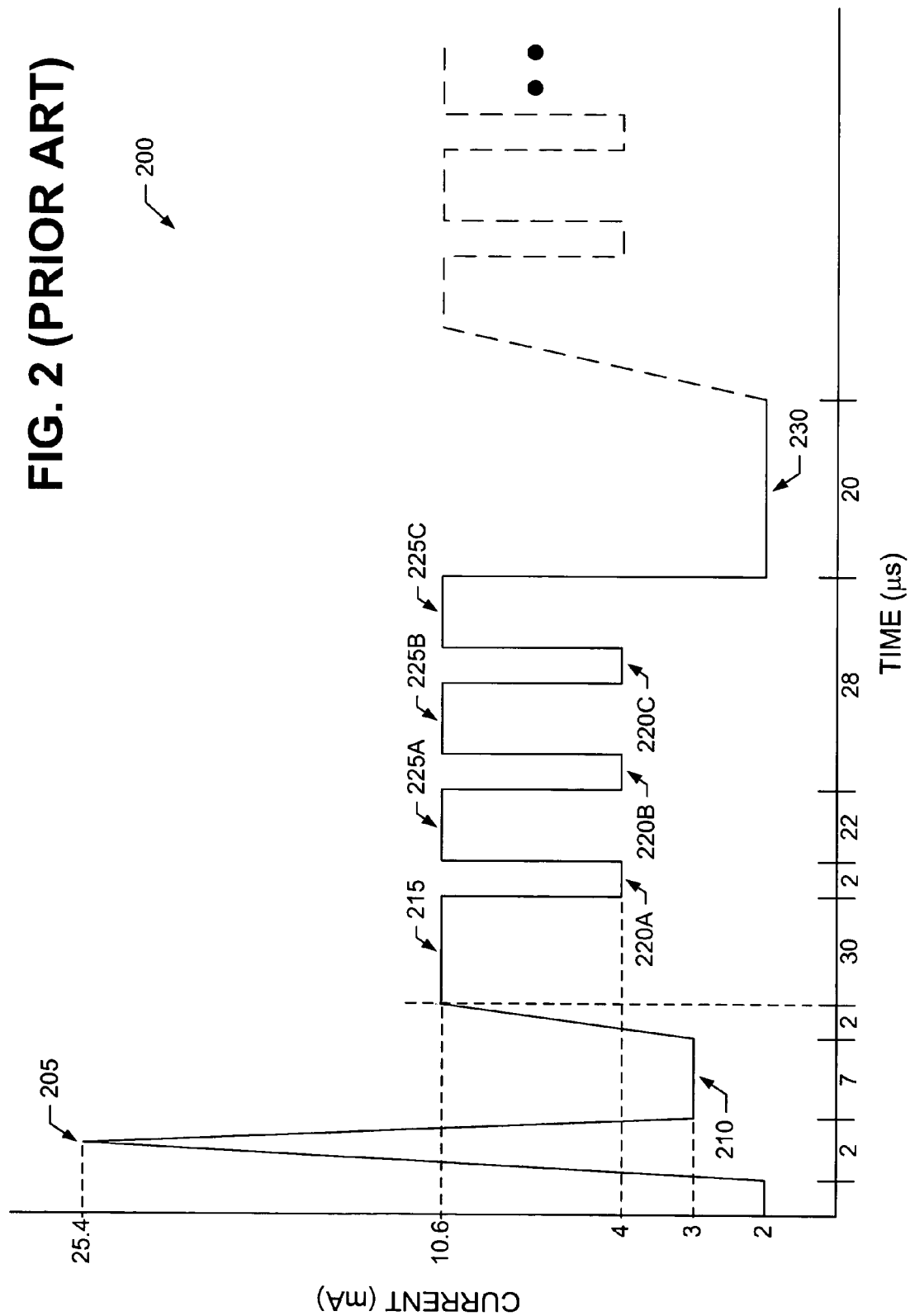
FIG. 2 illustrates a prior art waveform including a plurality of pulses of current that may be applied to a write state machine.

FIG. 2 illustrates a waveform 200 including a plurality of pulses of current that may be generated by the pulse generator 120 and applied to the write state machines 105A, 105B. The waveform 200 may begin, in time, with a short initial pulse 205 of current having a large amplitude, which may be used to initiate a write or erase operation to the individual memory cell and also to supply the majority of the current to the cell of the stacked memory array 115. In an exemplary embodiment, the initial pulse 205 may have an amplitude of 25.4 milliamperes for approximately 1 microsecond, and may have a pulse width of approximately 2 microseconds.

After the initial pulse 205, there may be a period of time, or a delay 210, during which time the system 100 may read what current is on each cell of the stacked memory array 115. In an exemplary embodiment, the delay 210 may be approximately 7 microseconds long at 3 milliamperes. After the delay 210, there may be a second pulse 215, which may be used to supply additional current to the write state machine 105A, 105B. Unlike the initial pulse 205, this second pulse 215 may have a peak amplitude that is less than the pulse amplitude of the initial pulse 205. In an exemplary embodiment, the peak amplitude may have a plateau at 10.6 milliamperes and a pulse width of approximately 30 microseconds, with a rise time of approximately 2 microseconds. After this second pulse 215, there may be a plurality of additional brief delays 220 with smaller pulses 225 therebetween. In an exemplary embodiment, the plurality of brief delays 220 with smaller pulses 225 therebetween may include three brief delays 220 and three pulses 225. During the brief delays 220 the system 100 may read the voltage on the individual cells of the stacked memory array 115. Each brief delay 220 may last for approximately 2 microseconds at about 4 milliamperes. The three pulses 225 may indicate when additional current is being supplied to the write state machine 125. Each of the three pulses 225 may last for approximately 22 microseconds at 10.6 milliamperes.

After the plurality of additional brief delays 220 and pulses 225, there may be a second delay 230, which may permit the system 100 to verify if there is enough voltage on each cell of the stacked memory array 115. The second delay 230, in an exemplary embodiment, may last for about 20 microseconds at 2 milliamperes. If the memory controller 130 determines that enough voltage has not been built up within the memory cell, then an additional plurality of pulses 225, which are shown in the dashed line in the figure, may be generated by the pulse generator 120 to increase the voltage on the cells of the stacked memory array 115 to the appropriate value.

Although waveform 200 h has been described as having certain properties, including amplitudes and durations of individual pulses, those skilled in the art will appreciate that pulses of current having other amplitudes and durations, may be applied individually or in combination to the write state machines 105A, 105B, which may create other waveforms that are within the scope of the embodiments of the present invention. For example, another waveform within the scope of the embodiments of the present invention may have a series of pulses therein, wherein all pulses may be of equal amplitude, duration, and period, such as the waveforms depicted in FIG. 6.

Figure 3:
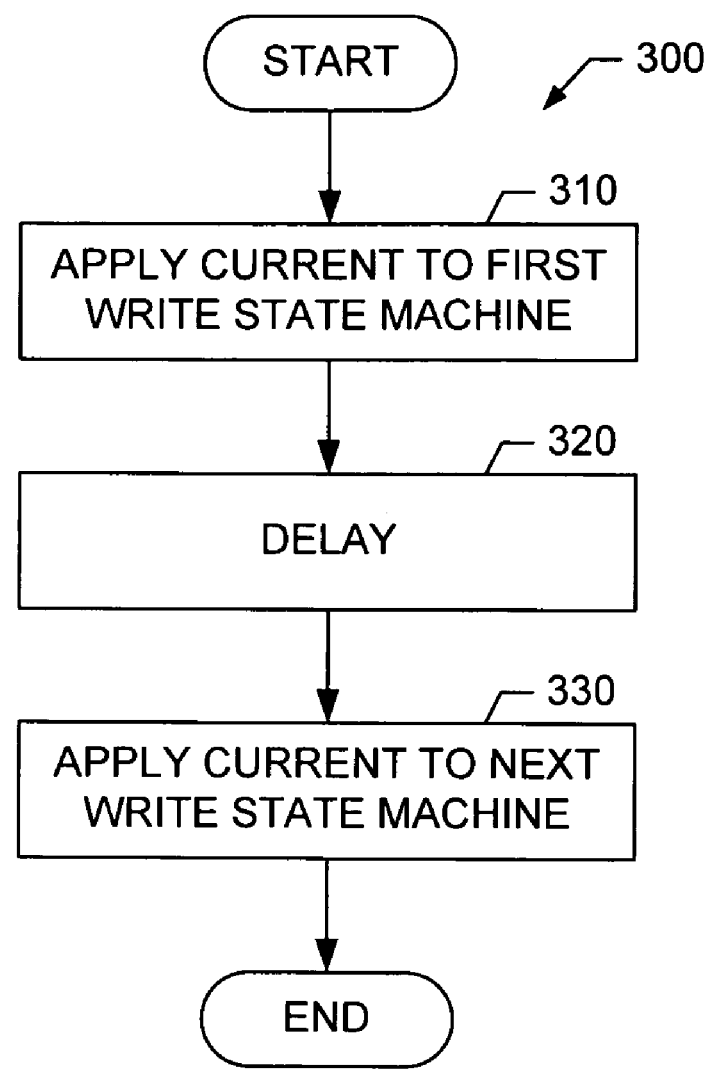
FIG. 3 is a logical flow diagram illustrating a routine of sequencing multiple write state machines according to some embodiments of the present invention.

FIG. 3 is a logical flow diagram illustrating a routine 300 of sequencing multiple write state machines 105A, 105B according to some embodiments of the present invention. Starting at 310, the pulse generator 120 may apply current, in the form of a first initial pulse, to the first write state machine 105A. At 320, the delay circuit 125 may inject a time-delay $\Delta t$ into the system 100 so that a initial pulse applied to the second write state machine 105B may occur after the first initial pulse is supplied to the first write state machine 105A in accordance with an exemplary embodiment of the present invention. In an alternative exemplary embodiment, at 320, the delay circuit 125 may inject a time-delay $\Delta t$ into the system 100 so that the initial pulse applied to the second write state machine 105B may occur during the time of the delay between the first plurality of three brief delays and pulses and the second plurality of brief delays and pulses applied to the first write state machine 125A. Then at 330, the pulse generator 120 may apply current to the next write state machine, which in an exemplary embodiment may be the second write state machine 105B. In an exemplary embodiment, the amount of time-delay $\Delta t$ may be at least as long as the amount of time of the first initial pulse applied to the first write state machine 105A so as to prevent the initial pulse applied to the first write state machine 105A from occurring simultaneously or during the rise and fall interval of the first initial pulse applied to the second write state machine 105B. Thus, in an exemplary embodiment, the second waveform may be offset from the first waveform by at least 2 microseconds. This may assure that the initial pulses applied to the first write state machine 105A and the second write state machine 105B do not line up, thereby minimizing the amount of current needed to generate waveforms 200 to the first and second memory arrays 110A, 110B.

Although the routine 300 has been described with respect to two write state machines 105, those skilled in the art will appreciate that the routine 300 may be applied to any number of write state machines 105A, 105B, such that there may be a time-delay $\Delta t$ between subsequent pulses of current applied to subsequent write state machines 105.

Figure 4:
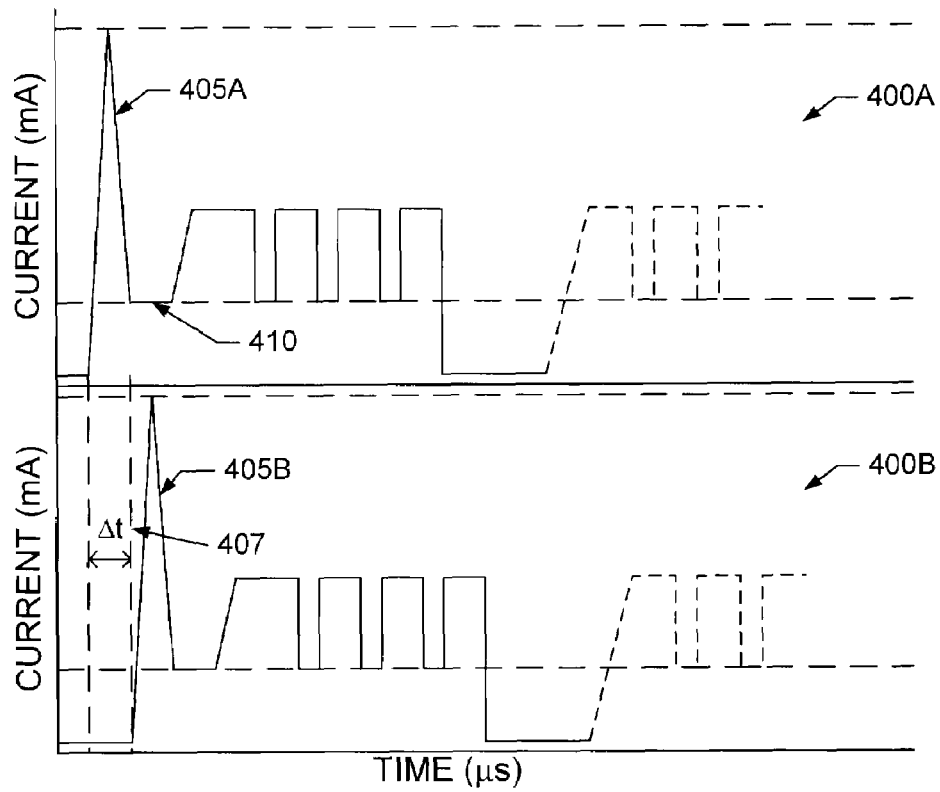
FIG. 4 is a timing diagram illustrating a pair of current waveforms for programming a stacked memory array in accordance with one embodiment of the present invention.

FIG. 4 is a timing diagram illustrating a pair of current waveforms 400A, 400B for programming the stacked memory array 115 in accordance with one embodiment of the present invention. In an exemplary embodiment, the pulse generator 120 may apply the first pulse 405A of current of the plurality of pulses, which together may form the first waveform 400A, to the first write state machine 105A. Then, the delay circuit 125 may inject a time-delay $\Delta t$ 407 before the pulse generator 120 may apply a first pulse 405B of the plurality of pulses, which together may form the second waveform 400B, to the second write state machine 105B. Thus, in an exemplary embodiment, the initial pulse 405A of the first waveform 400A may be applied to the first write state machine 105A and then the initial pulse 405B of the second waveform 400B may be applied to the second write state machine 105B at a time of at least 2 microseconds after the initial pulse 405A of the first waveform 400A. Therefore, in an exemplary embodiment, the second initial pulse 405B may occur during the time of the first delay 410 of the first waveform 400A, and thus, in an exemplary embodiment, the second waveform 400B may be delayed a period equal to Δt 407. Those skilled in the art will appreciate that the length of the time-delay Δt 407 between the first waveform 400A and the second waveform 400B may be in the range of microseconds so that the entire second initial pulse 405B may occur during the first delay 410 in the waveform 400A having a plurality of pulses applied to the first write state machine 105A.

Figure 5:
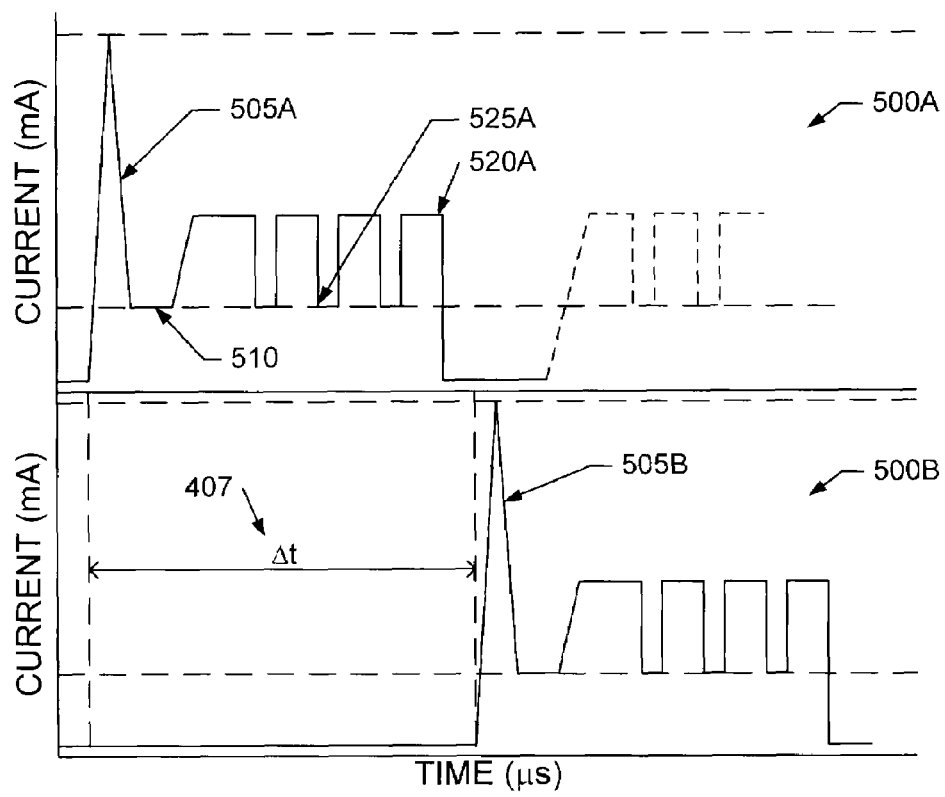
FIG. 5 is a timing diagram illustrating a pair of current waveforms for programming a stacked memory array in accordance with another embodiment of the present invention.

FIG. 5 is a timing diagram illustrating a pair of current waveforms 500A, 500B for programming a stacked memory array 115 in accordance with another embodiment of the present invention. In an exemplary embodiment, the pulse generator 120 may apply the first pulse 505A of current of the plurality of pulses, which together may form the first waveform 505A, to the first write state machine 105A. Then, the delay circuit 125 may inject a time-delay Δt 507 before the pulse generator 120 may apply a first pulse 505B of the plurality of pulses, which together may form the second waveform 500B, to the second write state machine 105B. Thus, the initial pulse 505A of the first waveform 505A may be applied to the first write state machine 105A and then the initial pulse 505B of the second waveform 500B may be applied to the second write state machine 105B at some time after the initial pulse 505A of the first waveform 500A. Therefore, in an exemplary embodiment, the second initial pulse 505B may occur during the time of the second delay 530 of the first waveform 500A, and thus, in an exemplary embodiment, the second waveform 500B may be delayed a period equal to Δt 507. Those skilled in the art will appreciate that the length of time the second waveform 500B may be delayed may be in the range of 93 microseconds to 111 microseconds so that the entire second initial pulse 505B may occur during the second delay 530 in the waveform 500A having a plurality of pulses applied to the first write state machine 105A.

Also, those skilled in the art will appreciate the length of time that the second waveform 500B may be delayed may be other amounts of time so long as that when the total amount of current in the system 100 is aggregated, the voltage regulator may accommodate the aggregated current. Thus, it may be within the scope of the embodiments of the present invention to delay the second initial pulse 505B that may be applied to the second write state machine 105B such that a portion of the second initial pulse 505B may overlap a portion of the first initial pulse 505A that may be applied to the first write state machine 105A. Because in some exemplary embodiments, the peak amplitudes of the two initial pulses 505A and 505B may not occur simultaneously, a standard voltage regulator may accommodate the total current of the system 100 at any given time.

In exemplary embodiments, the time delay Δt 507 between the first waveform 500A and the second waveform 500B may be between 2 and 111 microseconds, which may create a minimal delay in the amount of time the system 100 requires to program the stacked memory arrays 115, as compared to the seconds added if the write state machines 105 were to be programmed sequentially. Additionally, by creating a time-delay Δt 507 between the two waveforms 505A and 505B applied to the two write state machines 105, the overall cost of manufacturing and operating the system 100 may decrease as compared to the cost of manufacturing and operating a system in which the write state machines 105 are programmed in parallel (i.e., simultaneously). This is due in part to the fact that in many cases, a new regulator should be added to the system to accommodate the larger amounts of current and in part to the fact that a lesser amount of current may be applied simultaneously.

Figure 6:
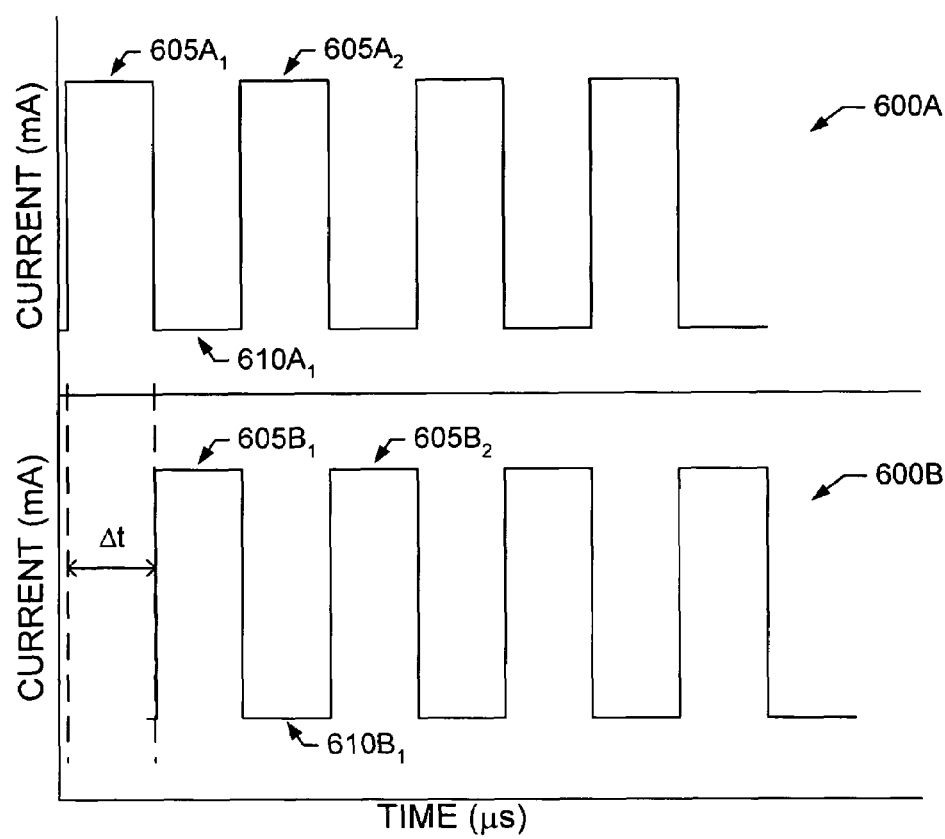
FIG. 6 is a timing diagram illustrating a pair of current waveforms for programming a stacked memory array in accordance with still another embodiment of the present invention.

FIG. 6 is a timing diagram illustrating a pair of current waveforms 600A and 600B for programming a stacked memory array 115 in accordance with still another embodiment of the present invention. Waveforms 600A and 600B may include a series of pulses 605 therein wherein all pulses 605 may be of equal amplitude, duration, and period. In an exemplary embodiment, the pulse generator 120 may apply the first pulse $605A_1$ of current of the first waveform 600A, to the first write state machine 105A. Then, the delay circuit 125 may inject a time-delay Δt before the pulse generator 120 may apply a first pulse $605B_1$ of current of the second waveform 600B to the second write state machine 105B. Therefore, in an exemplary embodiment, the second initial pulse $605B_1$ may occur during the time of a first delay $610A_1$ of the first waveform 600A, and thus, in an exemplary embodiment, the second waveform 600B may be delayed a period equal to Δt.

Other alternative embodiments will become apparent to those skilled in the art to which an exemplary embodiment pertains without departing from its spirit and scope. Accordingly, the scope of the embodiments of the present invention may be defined by the appended claims rather than the foregoing description.

What is claimed is:

1. A system, comprising:
   a first write state machine;
   a second write state machine;
   a pulse generator operable to generate a first current draw waveform of current to the first write state machine and a second current draw waveform of current to the second write state machine, wherein the first current draw waveform is substantially similar to the second current draw waveform and include a large initial pulse of current followed by a plurality of smaller pulses of current; and
   a delay circuit operable to inject a time delay between the first current draw waveform and the second current draw waveform, and wherein the time delay is less than a duration of the current draw waveform applied to the first write state machine and greater than a duration of the large initial pulse of the first current draw waveform.

2. The system of claim 1, wherein the large initial pulse of current of the second current draw waveform which is applied to the second write state machine occurs during a delay between the large initial pulse of current applied to the first write state machine and the plurality of smaller pulses of current applied to the first write state machine.

3. The system of claim 1, wherein the large initial pulse of current of the second current draw waveform which is applied to the second write state machine occurs during a delay between a first plurality of smaller pulses of current applied to the first write state machine and a second plurality of smaller pulses of current applied to the first write state machine.

4. The system of claim 1, wherein the large initial pulse of current which is applied to the first write state machine has an amplitude substantially equal to the amplitude of the large initial pulse of current which is applied to the second write state machine.

5. The system of claim 1, wherein the plurality of additional pulses have amplitudes that are less than or equal to half of the amplitude of the large initial pulse of current applied to the first write state machine.

6. A method, comprising:
   applying a first current draw waveform of current to a first write state machine;

delaying a second current draw waveform of current by a predetermined amount of time from a start of the first current draw waveform, wherein the first current draw waveform is substantially similar to the second current draw waveform and include a large initial pulse of current followed by a plurality of smaller pulses of current; and applying the second pulse of current to a second write state machine, wherein the predetermined amount of time is less than a duration of the first current draw waveform and greater than a duration of the large initial pulse of the first current draw waveform.

7. The method of claim 6, wherein the large initial pulse of current which is applied to the first write state machine has an amplitude substantially equal to the amplitude of the large initial pulse of current which is applied to the second write state machine.

8. The method of claim 6, wherein the second current draw waveform of current which is applied to the second write state machine occurs during a delay between the large initial pulse of current applied to the first write state machine and the plurality of smaller pulses of current applied to the first write state machine.

9. The method of claim 6, wherein the second current draw waveform of current which is applied to the second write state machine occurs during a delay between a first plurality of smaller pulses of current applied to the first write state machine and a second plurality of smaller pulses of current applied to the first write state machine.

10. The method of claim 6, wherein the plurality of additional pulses have amplitudes that are less than or equal to half of the amplitude of the large initial pulse of current applied to the first write state machine.

11. A computer-readable medium having computer-executable instructions, comprising:

applying a first current draw waveform of current to a first write state machine;

delaying a second current draw waveform of current by a predetermined amount of time from a start of the first current draw waveform, wherein the first current draw waveform is substantially similar to the second current draw waveform and include a large initial pulse of current followed by a plurality of smaller pulses of current; and applying the second pulse of current to a second write state machine, wherein the predetermined amount of time is less than a duration of the first current draw waveform and greater than a duration of the large initial pulse of the current draw waveform.

12. The computer-readable medium of claim 11, wherein the large initial pulse of current which is applied to the first write state machine has an amplitude substantially equal to the amplitude of the large initial pulse of current which is applied to the second write state machine.

13. The computer-readable medium of claim 11, wherein the second current draw waveform of current which is applied to the second write state machine occurs during a delay between the large initial pulse of current applied to the first write state machine and the plurality of smaller pulses of current applied to the first write state machine.

14. The computer-readable medium of claim 11, wherein the second current draw waveform of current which is applied to the second write state machine occurs during a delay between a first plurality of smaller pulses of current applied to the first write state machine and a second plurality of smaller pulses of current applied to the first write state machine.

15. The computer-readable medium of claim 11, wherein the plurality of additional pulses have amplitudes that are less than or equal to half of the amplitude of the large initial pulse of current applied to the first write state machine.

* * * * *